US008452427B2

(12) United States Patent
Madonna et al.

(10) Patent No.: US 8,452,427 B2
(45) Date of Patent: May 28, 2013

(54) SIGNAL PATH USING GENERAL-PURPOSE COMPUTER FOR AUDIO PROCESSING AND AUDIO-DRIVEN GRAPHICS

(75) Inventors: Robert P. Madonna, Osterville, MA (US); Michael C. Silva, Centerville, MA (US); Siegmar K. Eschholz, Osterville, MA (US)

(73) Assignee: Savant Systems, LLC, Hyannis, MA (US)

( * ) Notice: Subject to any disclaimer, the term of this patent is extended or adjusted under 35 U.S.C. 154(b) by 1332 days.

(21) Appl. No.: 11/520,213

(22) Filed: Sep. 13, 2006

(65) Prior Publication Data

US 2008/0075305 A1 Mar. 27, 2008

(51) Int. Cl.
*G06F 17/00* (2006.01)
*H03F 99/00* (2009.01)

(52) U.S. Cl.
USPC .............................................. 700/94; 381/120

(58) Field of Classification Search
USPC ................. 381/104, 107, 108, 120, 101–103, 381/56; 330/2; 700/94
See application file for complete search history.

(56) References Cited

U.S. PATENT DOCUMENTS 5,652,542 A * 7/1997 Fink ................................. 330/2
5,751,816 A 5/1998 Howard
6,111,755 A 8/2000 Park
6,397,186 B1 * 5/2002 Bush et al. .................... 704/274
2005/0058307 A1 * 3/2005 Yang et al. .................... 381/119
2005/0177287 A1 * 8/2005 Wang et al. ..................... 701/36
2006/0045291 A1 * 3/2006 Smith ........................... 381/119
2006/0268969 A1 * 11/2006 Kimura et al. ................ 375/225

FOREIGN PATENT DOCUMENTS

EP 1 117 030 A2 7/2001
EP 1 178 389 A2 2/2002

OTHER PUBLICATIONS

"Notification of Transmittal of the International Search Report and the Written Opinion of the International Searching Authority, or the Declaration," International Filing Date: Sep. 13, 2007, International Application No. PCT/US2007/019908, Applicant: Savant Systems, LLC, Date of Mailing: May 27, 2008, pp. 1-12.

* cited by examiner

*Primary Examiner* — Xu Mei
(74) *Attorney, Agent, or Firm* — Cesari and McKenna, LLP

(57) ABSTRACT

An audio system includes a general-purpose computer in the audio signal path to provide, or to enhance, pre-amplification functions. In one embodiment, in response to audio signals from a pre-amplifier, a programmable multimedia controller including the general-purpose computer generates control commands and passes these control commands via a signal path back to the pre-amplifier. In a second embodiment, rather than control a separate pre-amplifier, the programmable multimedia controller itself implements the pre-amplification functions. In yet another embodiment, a power amplifier includes the general-purpose computer and pre-amplification functions are implemented there. Also, a display screen shows a virtual control panel that is used to control the pre-amplification of audio signals. The virtual control panel provides a graphical user interface that simulates, replicates, or replaces with an alternate arrangement, the physical controls and readouts found on the control panel of a physical device. Audio-interactive graphics, images and/or artwork may also be shown on the display screen.

30 Claims, 4 Drawing Sheets

SIGNAL PATH USING GENERAL-PURPOSE COMPUTER FOR AUDIO PROCESSING AND AUDIO-DRIVEN GRAPHICS

BACKGROUND OF THE DISCLOSURE

1. Field of the Disclosure

The present disclosure relates generally to audio amplification and more particularly to use of a general-purpose computer for pre-amplification in an audio signal path.

2. Background Information

In a typical high-end audio system, audio data from an audio source passes through several devices along an audio signal path, before being heard by a listener. Audio signals generally originate from a playback device, such as a compact disk (CD) player, Digital Video Disc (DVD) player, turntable, portable mp3 music player; or a receiver device, such as radio tuner or Internet interface. The audio signals may be analog or digital depending on the particular playback or receiver device used. The audio signals often pass to a pre-amplifier, which may be a discrete device or a portion of an Audio/Video receiver. A function of the pre-amplifier is to amplify possibly low-level, high impedance analog audio signals to "line-level," an accepted signal strength usually stated in terms of decibel volts (dBV). Most commonly used consumer audio equipment has been adapted for, and work best with, a line-level of about −10 dBV, which corresponds to signals of about 0.3162 volts RMS.

In addition to converting analog audio signals to line-level, pre-amplifiers often apply equalization, tone control, and mixing/effects to both analog and digital audio signals. Equalization refers to the process of amplifying or reducing the level of audio signals in different frequency ranges, to remove irregularities introduced by components in the audio signal path. Such equalization may be implemented with a combination of low pass, high pass, band pass, and/or band stop filters. Tone control similarly involves changing the level of audio signals in selected frequency ranges, yet rather than attempt to correct for irregularities, tone control attempts to enhance audio sound by adding more of a desirable tone (amplifying the signal strength in those frequency ranges), or by reducing undesired tones (reducing the signal strength in those frequency ranges). Well known bass, treble, and graphic equalizer adjustments are examples of tone control. Finally, mixing/effects encompass a wide variety of simulated surround sound, environmental effects, soundscapes, and other complex manipulations of audio signals common in modern audio systems.

After pre-amplification, the audio signals are generally passed through an A/V Receiver, where switching functions are performed, as well as digital to analog conversion functions, if necessary. Then, the audio signals are passed to a power amplifier, which may be part of the A/V receiver, or, especially in high-end systems, a separate unit dedicated to power amplification. The power amplifier provides a current gain to the now analog audio signals, bringing the signals to a level of tens, or hundreds, of watts, so they may drive loudspeakers or other sound delivery devices. After this amplification, the analog audio signals are generally ready to be delivered to, and drive, sound delivery devices.

One shortcoming of a conventional audio signal path is its inflexible nature. Audio devices are generally purpose built and offer the user little possibility for customization or upgrade. For example, a conventional pre-amplifier may be configured to provide certain types of equalization and tone control, and a user may be able to select from among the types provided. Yet most conventional pre-amplifiers offer little opportunity to upgrade the device to obtain additional functionality, for example, via a software download from the Internet. Instead, a user must generally purchase a new pre-amplifier that has been hard-wired with the additional functionality. Similarly, many pre-amplifier have a variety of dials, readouts, and controls on a physical control panel, often the front panel of the unit. These are generally single purpose hardware devices. A user who purchases the pre-amplifier must accept their appearance and functionality, and may not customize or alter them in any way. Finally, conventional pre-amplifiers generally lack the ability to output audio-interactive graphics and images for display to a user. Many users find such graphics and images entertaining, and a desirable addition to their listening experience. While some users accept these limitations, other users desire greater flexibility, customizability, and graphics display in the pre-amplification stage of the audio signal path of their audio system.

SUMMARY OF THE DISCLOSURE

In brief summary, the present disclosure details the incorporation of a general-purpose computer into the audio signal path of an audio system, to provide or to enhance pre-amplification functions.

According to a first embodiment, audio signals are passed from a first output of a conventional pre-amplifier to a programmable multimedia controller that includes the general-purpose computer. The general-purpose computer in the programmable multimedia controller interprets and analyzes the audio signals. In response thereto, the programmable multimedia controller generates control commands and passes these control commands via a signal path back to the pre-amplifier. By sending appropriate control commands, particular equalization, tone control, and mixing/effects are implemented with the pre-amplifier. Since the programmable multimedia controller monitors the audio signals in real-time, the control of the pre-amplifier, in some configurations, is dynamically responsive to changes in the audio stream. This permits advanced pre-amplification functions beyond those that could be provided by a conventional pre-amplifier in isolation. In other configurations, in addition to control information, audio signals are passed back from the programmable multimedia controller to the pre-amplifier. Such audio signals are combined (i.e. mixed) at the pre-amplifier with the audio signals from the audio source to create environmental effects or other types of special effects. After pre-amplification, the audio signals are passed from a second output of the pre-amplifier to a power-amplifier, and thereafter to a sound output device.

According to a second embodiment, rather than control a separate pre-amplifier, the programmable multimedia controller, using its included general-purpose computer, implements the pre-amplification functions itself. The programmable multimedia controller includes executable program code that when executed on the general-purpose computer implements equalization, tone control, and mixing/effects on the audio signals while they are in digital form at the programmable multimedia controller. After equalization, tone control, and mixing/effects are applied, the audio signals are output to a digital to analog (D/A) converter and then passed to a power amplifier and sound delivery devices.

According to a third embodiment, rather employ a general-purpose computer incorporated in a programmable multimedia controller to implement the pre-amplification functions, a general-purpose computer is incorporated into a power amplifier to perform these functions. In such an embodiment, the programmable multimedia controller may be employed solely to send control signals to other devices, or may be absent from the system. The general-purpose computer in the power amplifier implements equalization, tone control, and mixing/effects on the audio signals, and these signals are output to sound delivery devices.

Furthermore, a virtual control panel on a display screen is provided in the first, second, and third embodiments for controlling pre-amplification of the audio signals. In the first and second embodiments, the display screen is coupled to, or incorporated into, the programmable multimedia controller, while in the third embodiment, the display screen is coupled to, or incorporated into, the power amplifier. The virtual control panel displayed on the display screen is a graphical user interface that simulates, replicates, or replaces with an alternate arrangement, the physical controls and readouts found on a physical control panel of a physical device. In one configuration, the dials and other indicators found on the physical control panel of a pre-amplifier are simulated as graphic representations on the virtual control panel, permitting the user to manipulate the virtual control panel rather than the physical control panel. In another configuration, the virtual control panel contains readouts and controls different from, or beyond, those provided by a conventional pre-amplifier, to allow for advanced control schemes. A user may readily change the configuration of the virtual control panel, including which readouts and controls are displayed, their locations, and certain aesthetic characteristics, such as their colors and designs.

In addition to displaying a virtual control panel, the display screen is further adapted to display audio-interactive graphics, images, and artwork. Such graphics, images and artwork are responsive to the rhythm of the audio signals and/or to the amplitude of the audio signals in certain frequency bands. Furthermore, the graphics, images and artwork are related to a particular user profile of a particular user. Accordingly, depending on the user currently controlling the system, different graphics and images may be shown.

BRIEF DESCRIPTION OF THE DRAWINGS

The description below refers to the accompanying drawings, of which.

DETAILED DESCRIPTION OF ILLUSTRATIVE EMBODIMENTS

As used herein, the term "programmable multimedia controller" should be interpreted broadly as a device capable of controlling, switching data between, and/or otherwise interoperating with a variety of electronic devices, such as audio, video, telephony, data, security, motor-operated, relay-operated, and/or other types of devices. By interacting with these devices, a programmable multimedia controller implements an integrated multimedia control solution. Further details regarding the design and function of a programmable multimedia controller are provided in U.S. patent application Ser. No. 11/314,664, entitled "System and Method for a Programmable Multimedia Controller," by Robert P. Madonna, et al., the teachings of which are expressly incorporated into this disclosure by reference.

Figure 1:
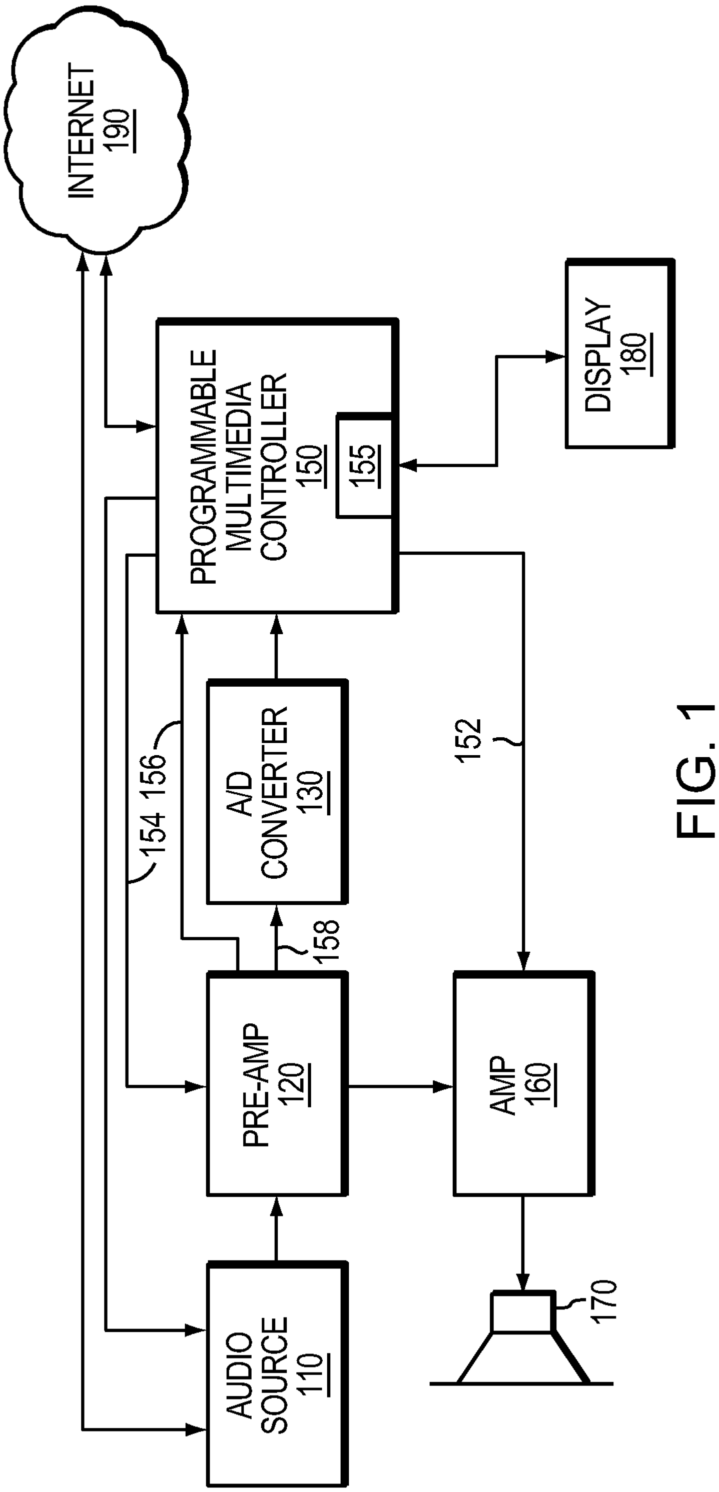
FIG. 1 is a schematic block diagram of an audio signal path of a first example audio system that incorporates a programmable multimedia controller including a general-purpose computer to implement pre-amplification functions.

FIG. 1 is a schematic block diagram of an audio signal path of an example audio system that incorporates a programmable multimedia controller 150 including a general-purpose computer 155 to implement pre-amplification functions. While for purposes of simplicity, a single audio signal path is shown and discussed in relation to FIGS. 1-3, it should be remembered that a number of audio signal paths are generally employed in real-world systems to provide for a number of independent audio channels to implement multiple audio zones and/or various surround sound configurations. Accordingly, the teachings below intended to be readily extended to such multi-channel configurations.

An audio source 110, for example a playback device (such as a CD player, DVD player, or turntable) or a receiver device (such as a radio tuner or internet interface) originates audio signals. These audio signals are passed to a conventional pre-amplifier, which in this example is a separate audio component, but alternately may be a portion of an A/V Receiver or other audio device. The pre-amplifier 120 works in conjunction with, and under the control of, the programmable multimedia controller 150 to provided advanced pre-amplification functions and control beyond the ordinary capabilities of the conventional pre-amplifier 120. Such additional capabilities are facilitated by passing audio output signals from the conventional pre-amplifier to the programmable multimedia controller 150. The audio output signals may take the form of digital signals transmitted on a digital pathway 156, or analog signals transmitted on a analog pathway 158. If analog signals are employed, the signals are passed through an analog to digital (A/D) converter 130 to produce a digital signal. While the A/D converter 130 is shown in FIG. 1 as a separate device, the A/D converter 130 may alternately be an integral portion of the pre-amplifier 120 or the programmable multimedia controller 150.

The programmable multimedia controller 150 includes one or more general-purpose computers 155. As used herein, the term "general-purpose computer" refers to any computing system capable of executing a general-purpose operating system, for example an OS X™ operating system or a Unix™ operating system. A general-purpose computer may take the form of a CPU card, a Single Board Computer (SBC), a PC/104 processing module, a conventional ATX form factor motherboard and CPU, an "off-the-shelf" small form factor computer, and an "off-the-shelf" large form factor or rack-mount computer. Further details regarding the use of a general-purpose computer 155 in a programmable multimedia controller 150 are provided in "System and Method for a Programmable Multimedia Controller," by Robert P. Madonna, et al.

In one embodiment, once the audio signals are received at the programmable multimedia controller 150, they are interpreted by the general-purpose computer 155, and control commands for the pre-amplifier 120 are generated in response thereto. These control commands are sent along a pathway 154, which may be a wired link, such as RS232 connection, or a wireless link, such as a WI-FI connection. By sending appropriate control commands along the pathway 154, particular equalization, tone control, and mixing/effects schemes are implemented with the pre-amplifier 120. For example, in response to user preferences, the programmable multimedia controller may measure the amplitude of the audio signals in selected frequency bands, and then command the pre-amplifier to adjust the amplitude in each frequency band to a desired level. The programmable multimedia controller 150 may thereafter monitor the audio signals generated by the pre-amplifier to verify that the appropriate adjustments have been made.

Since the programmable multimedia controller 150 monitors the audio signals in real-time, its control of the pre-amplifier 120, in some configurations, is dynamically responsive to changes in the audio stream. This permits advanced pre-amplification functions beyond those that could be provided by the conventional pre-amplifier 120 in isolation. For example, using the programmable multimedia controller 150, a user may select particular equalization and tone control schemes for differing types of music, or for audio with different audio quality. In this manner, the user may select that classical music is equalized in one manner, while bass-heavy rock music equalized in another. Similarly, the user may select that a low quality audio signal, such as that generated from a low bit-rate Internet audio feed, is subjected to extensive equalization and tone-control, to improve (to the extent possible) the listening experience, while a high-quality audio signal is subject to minimal equalization and tone-control. The computational power of the general-purpose computer 155 is used to implement these dynamic pre-amplification functions.

In another embodiment, in addition to control information, the pathway 154 to the pre-amplifier 120 passes audio signals from the programmable multimedia controller 150 to the pre-amplifier. Such audio signals may be used in a variety of manners, depending on the configuration of the programmable multimedia controller 150 and the pre-amplifier 120. For example, in one configuration the audio signals from the programmable multimedia controller 150 are combined (i.e., mixed) with the audio signals from the audio source 110 to create environmental effects or other special effects. In another configuration, the audio signals from the programmable multimedia controller 150 are used in place of the original audio signals. That is, they are passed to additional outputs of the pre-amplifier 120 that drive the rest of the audio signal path.

The programmable multimedia controller is coupled to a display 180, such as a touch sensitive LCD screen, or a television screen, to facilitate user control. In one embodiment, the display is arranged as the front panel (front face) of the programmable multimedia controller, while in another embodiment the display is a separate unit, such as a table top display screen, interconnected to the programmable multimedia controller by a wired or wireless connection. The display is adapted to show a virtual control panel for pre-amplification functions, among other functions. A virtual control panel is a graphical user interface that simulates, replicates, or replaces with an alternate arrangement, the physical controls and readouts found on a physical control panel of a physical device. For example, the dials and other indicators found on the physical control panel of the pre-amplifier 120 may be simulated as graphic representations on the virtual control panel display. Similarly, the control knobs and buttons of the physical control panel may be shown on the virtual front panel, and their manipulation used to control pre-amplification.

Since the virtual control panel is a graphical construct, it may also be designed quite differently from any physical control panel, and may contain readouts and controls beyond those provided by physical units. In this manner, the virtual control panel may provide advanced control schemes using the graphics capabilities of the general-purpose computer 155. For example, the virtual control panel itself may be responsive to the beat or tones of the music in the audio stream, such that its appearance changes in response thereto. Further, a user may readily change the configuration of the virtual control panel, choosing which readouts and control are to be displayed, their locations, and aesthetics such as their colors and designs. Such flexibility allows the user to modify their system as their preferences change, absent the purchase of new hardware devices. Further discussion of the virtual control panel is provided below in reference to FIG. 3.

In addition to using the display screen to show a virtual control panel, the display screen is further adapted to display audio-interactive graphics, images, and/or artwork. Using the processing power of the general-purpose computer 155, the audio signals may be analyzed according to any of a number of algorithms to extract the rhythm (i.e. the beat) of the audio signals. Further, the amplitude of the audio signals in certain frequency ranges may be measured, as discussed above. In response to such characteristics of the audio signals, graphics, images and/or artwork are arranged to move, gyrate, or distort in response to the music, to create an audio-interactive display. The particular graphics, images, or artwork shown are in some configurations responsive to the preferences of a particular user, and may displayed only when that user is operating the system. One technique for determining when a particular user is operating the system is described in U.S. patent Ser. No. 11/520,328, entitled "Remote Control Unit for a Programmable Multimedia Controller", by Robert P. Madonna, et al., the teachings of which are expressly incorporated into this disclosure by reference.

The programmable multimedia controller 150 is also connected via a network connection to the Internet 190, or another wide area network (WAN) or local area network (LAN). Via the network connection, pre-designed virtual control panels may be downloaded as executable program code. Similarly additional equalization, tone-control, and effects may be downloaded as executable program code. As the programmable multimedia controller includes a general-purpose computer 155 with a general-purpose operating system, such executable program code may readily be executed to modify the system's configuration, function, and appearance on the display 180.

Returning to discussion of the audio signal path, the pre-amplifier 120 passes analog audio signals via an output to a power amplifier 160, which provides a current gain to the signals, bringing the them to a level sufficient to drive at least one sound deliver device 170, such as a loudspeaker. The power amplifier 160 further receives control commands from the programmable multimedia controller 150 along a path 152, for example, control commands to adjust volume. While only a single sound delivery device is shown in FIG. 1, most practical systems will contain a number of devices to implement stereo or surround sound configurations. Accordingly, it should be remembered that the techniques disclosed herein are applicable to a variety of multi-channel configurations.

Further, while the power amplifier 160 is shown in FIG. 1 as a separate hardware device, it should be remembered that the power amplifier 160 may be integrated as a portion of an A/V receiver or of the programmable multimedia controller 150.

Figure 2:
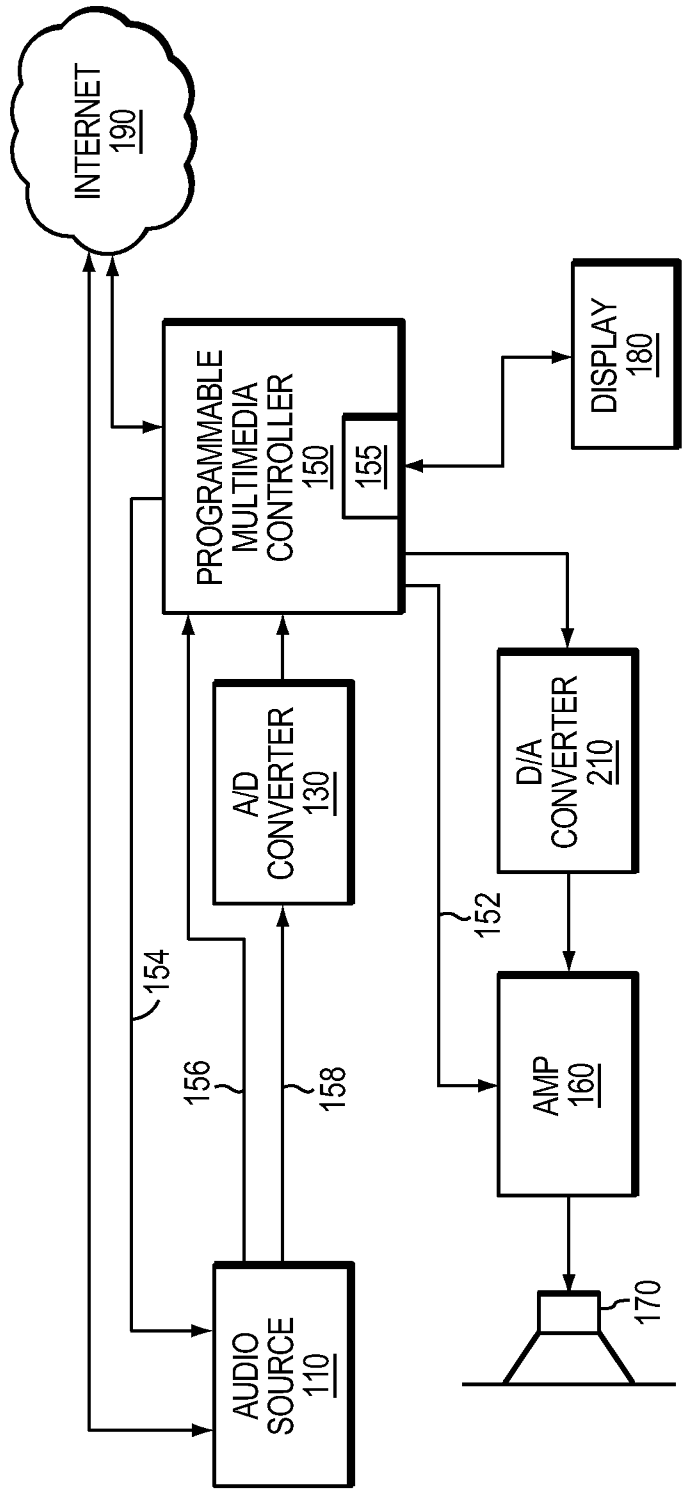
FIG. 2 is a schematic block diagram of an audio signal path of a second example audio system that incorporates a programmable multimedia controller including a general-purpose computer to implement pre-amplification functions.

FIG. 2 is a schematic block diagram of an audio signal path of a second example audio system that incorporates a programmable multimedia controller 150 including a general-purpose computer 155 to implement pre-amplification functions. Rather than control a separate conventional pre-amplifier, in the second example audio system the programmable multimedia controller 150 itself implements the pre-amplification. As in FIG. 1, analog 158 or digital audio signals 156 originate from an audio source 110. If the signals are analog signals, they are converted to a digital format via an A/D converter 130, shown in FIG. 2 as a separate device, yet which alternately may be integrated into the programmable multimedia controller 150. The programmable multimedia controller 150 includes a general-purpose computer 155 that runs executable program code that implements equalization, tone control, and/or mixing/effects on the audio signals while they are in digital form. A variety of algorithms to accomplish these manipulations are well known in the art, and may be pre-programmed into the programmable multimedia controller 150. Further, the executable program code may readily be updated via the network connection to the internet 190, or other WAN or LAN connection, to provided additional functionality. As in FIG. 1, the programmable multimedia controller is coupled to, or incorporates a display 180 for display of a virtual control panel and audio-interactive graphics, images, and/or artwork. For details of such features the reader is referred to the description above presented in relation to FIG. 1, which are applicable to the second embodiment as well.

After equalization, tone control, and mixing/effects are applied, the audio signals are output to a digital to analog (D/A) converter 210, and then passed to a power amplifier 160. The power amplifier 160 is further controlled by control signals from the programmable multimedia controller 150 over pathway 152. Finally, the audio signals are passed to at least one sound delivery device 170.

Figure 3:
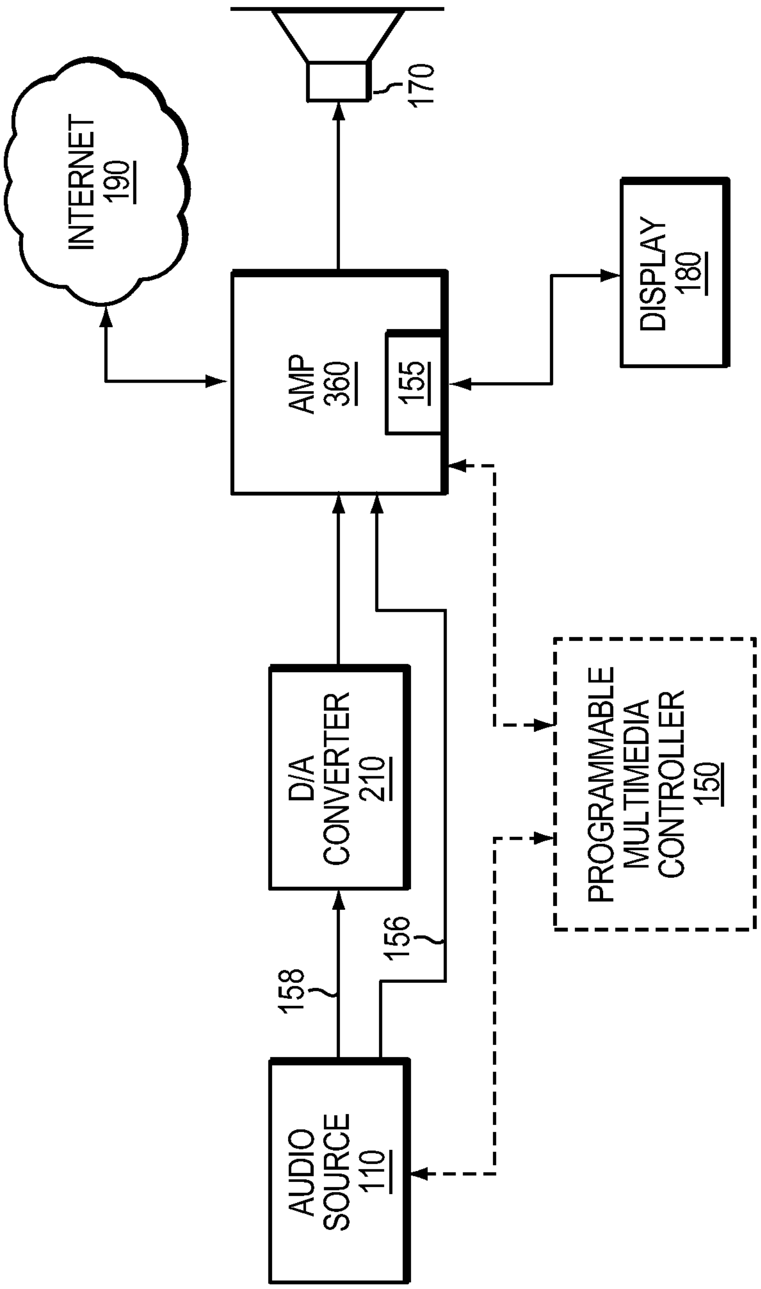
FIG. 3 is a schematic block diagram of an audio signal path of a third example audio system that incorporates a power amplifier including a general-purpose computer to implement pre-amplification functions.

FIG. 3 is a schematic block diagram of an audio signal path of a third example audio system that incorporates a power amplifier 360 including a general-purpose computer 155 to implement pre-amplification functions. In this example, while the programmable multimedia optionally may be present (as shown by dotted lines in FIG. 3), it is not required and does not take a part in pre-amplification functions, nor are audio signals passed thereto (yet control signal may issue from the programmable multimedia controller). Analog 158 or digital audio signals 156 originate from an audio source 110. If the signals are digital signals, they are converted to analog format by a D/A converter 210, shown in FIG. 3 as a separate device, yet which alternately may be integrated into the power amplifier 360. The power amplifier 360 includes a general-purpose computer 155 that runs executable program code that implements equalization, tone control, and/or mixing/effects on the audio signals while are at the power amplifier 360. The executable program code may readily be updated via the network connection to the internet 190, or other WAN or LAN connection, to provided additional functionality. The power amplifier 360 is coupled to, or incorporates a display 180 for display of a virtual control panel and audio-interactive graphics, images, and/or artwork. For details of such features the reader is referred to the description above presented in relation to FIG. 1, which are applicable to this third embodiment as well. After equalization, tone control, and mixing/effects are applied, the audio signals are output to at least one sound delivery device 170. In this manner, advance pre-amplification functions may be provided by the power amplified 360 that incorporates a general-purpose computer 155.

Figure 4:
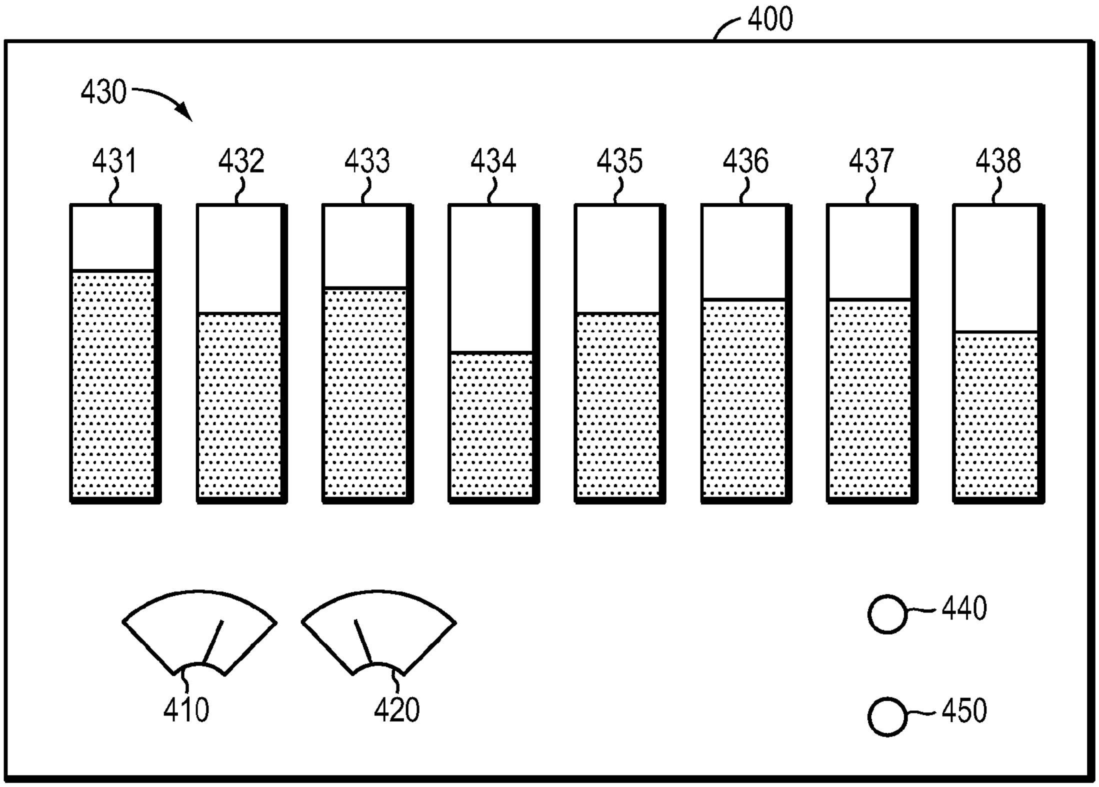
FIG. 4 is a diagram of an example virtual control panel for user control of pre-amplification functions, which may be used with the embodiments discussed in relation to FIG. 1, FIG. 2, or FIG. 3.

FIG. 4 is a diagram of an example virtual control panel 400 for user control of pre-amplification functions, which may be used with the embodiments discussed in relation to FIG. 1, FIG. 2, and FIG. 3. As discussed above, a virtual control panel may be configured to resemble the physical control panel of a hardware device, such as the pre-amplifier 120, or alternately may be arranged differently and possess readouts and controls not provided on any physical unit. Via a virtual control panel configuration tool executable on the general-purpose computer of the programmable multimedia controller, a user may manipulate the arrangement, color scheme, and other aspects of the virtual control panel's appearance, permitting customized design. Similarly, a number of pre-made virtual control panels may be downloaded as executable program code from the Internet 190 or other network, and executed upon the general-purpose computer to implement the pre-made schemes. In the illustrative example shown in FIG. 4, the virtual control panel includes a number of dials 410, 420 for display of the power output on various channels to different sound delivery devices. Further, a simulated 8-band graphic equalizer is shown with eight sliders 431-438, each band corresponding to a frequency range of the audio signals. By manipulating each of the sliders, for example by touching their representation on a touch-sensitive display or by activating them through gestures on a remote control unit, equalization and tone control over the audio signals is adjusted. In addition, buttons 440, 450 are shown that implement power on/off control and menu activation functions. By activating a menu, additional control options may be displayed to permit the user to enter more in-depth adjustment of the pre-amplification functions The foregoing description has been directed to several example embodiments. It will be apparent, however, that other variations and modifications may be made to the described embodiments, with the attainment of some or all of their advantages. Additionally, the procedures or processes discussed above may be implemented in hardware, software, embodied as a computer-readable medium having program instructions, firmware, or a combination thereof. Therefore, it is the object of the appended claims to cover all such variations and modifications as come within the true spirit and scope of the invention.

What is claimed is:

1. A system for providing pre-amplification functions in an audio signal path comprising:

a pre-amplifier configured to receive as an input an audio signal from an audio source; and a programmable multimedia controller separate from the pre-amplifier, the programmable multimedia controller configured to interact with and control a plurality of separate audio components, video components and motor-operated devices located about a building, the programmable multimedia controller including a general-purpose computer executing a general-purpose operating system that manages the operation of the programmable multimedia controller, the programmable multimedia controller configured to receive as an input the audio signal from an output of the pre-amplifier, the general-purpose computer of the programmable multimedia controller configured to analyze the audio signal and in response thereto cause the programmable multimedia controller to issue control commands to the pre-amplifier via a command pathway that couples the programmable multimedia controller to the pre-amplifier, the control commands to control pre-amplification functions of the pre-amplifier, wherein the pre-amplifier is further configured to perform the pre-amplification functions on the audio signal to adjust the audio signal and output the adjusted audio signal on the output coupled to the programmable multimedia controller and a second output coupled to a power amplifier, and wherein the programmable multimedia controller is further configured to monitor the adjusted audio signal to verify adjustments have been implemented.

2. The system of claim 1 wherein the pre-amplification functions includes one or more functions selected from the group consisting of equalization, tone control and audio mixing.

3. The system of claim 1 wherein the general-purpose computer of the programmable multimedia controller is configured to analyze the audio signal at least in part by measuring amplitude in a particular frequency band, and the control commands include one or more commands to adjust amplitude in the particular frequency band.

4. The system of claim 3 wherein the general-purpose computer of the programmable multimedia controller is further configured to monitor adjusted amplitude to verify adjustments have been implemented.

5. The system of claim 1 wherein at least some pre-amplification functions are performed in response to a bit-rate of the audio signal.

6. The system of claim 1 further comprising:

an audio pathway for passing a second audio signal from the programmable multimedia controller to the pre-amplifier; and the pre-amplifier is further configured to mix the second audio signal from the programmable multimedia controller with the audio signal from the audio source, prior to output of the adjusted audio signal on the second output coupled to the power amplifier.

7. The system of claim 1 wherein the programmable multimedia controller is configured to determine a rhythm of the audio signal and to generate graphics responsive at least to the rhythm, the graphics to be displayed on the display device.

8. The system of claim 1 wherein the programmable multimedia controller is configured to display a virtual control panel on the display device for controlling pre-amplification functions.

9. The system of claim 1 further comprising:

an second command pathway coupling the programmable multimedia controller to the power amplifier; and the programmable multimedia controller is further configured to send control commands to the power amplifier via the second command pathway to control the power amplifier.

10. A method for providing pre-amplification functions in an audio signal path comprising:

receiving an audio signal at a pre-amplifier;

providing the audio signal via an output of the pre-amplifier to a device that includes a general-purpose computer that executes a general-purpose operating system for analysis of the audio signal, the device that includes the general-purpose computer being separate from the pre-amplifier and configured to interact with and control a plurality of separate audio components, video components and motor-operated devices located about a building;

receiving back from the device that includes the general-purpose computer one or more control commands, the control commands to specify particular pre-amplification functions to be performed on the audio signal;

performing the specified pre-amplification functions on the audio signal at the pre-amplifier to adjust the audio signal; and providing the adjusted audio signal from the pre-amplifier on the output coupled to the device that includes a general-purpose computer, which is configured to monitor the adjusted audio signal to verify adjustments have been implemented, and on a second output.

11. The method of claim 10 wherein the specified pre-amplification functions includes one or more functions selected from the group consisting of equalization, tone control and audio mixing.

12. The method of claim 10 wherein the control commands include one or more commands to adjust amplitude in a particular frequency band.

13. The method of claim 12 further comprising:

monitoring adjusted amplitude to verify adjustments have been implemented.

14. The method of claim 10 wherein at least some pre-amplification functions are performed in response to a bit-rate of the audio signal.

15. The method of claim 10 further comprising:

receiving a second audio signal at the pre-amplifier from the device that includes the general-purpose computer; and mixing the second audio signal from the device that includes the general-purpose computer with the audio signal, prior to providing the adjusted audio signal from the pre-amplifier on the second output.

16. The method of claim 10 further comprising:

determining a rhythm of the audio signal; and generating graphics responsive at least to the rhythm.

17. The method of claim 10 further comprising:

displaying a virtual control panel for controlling pre-amplification functions.

18. The method of claim 10 wherein the control commands include one or more commands to adjust amplitude in a particular frequency band.

19. An apparatus for providing pre-amplification functions in an audio signal path comprising:

an input of a programmable multimedia controller coupled via a pathway to a separate pre-amplifier and configured to receive an audio signal from an output of the pre-amplifier;

an output of the programmable multimedia controller coupled to the pre-amplifier by a command pathway and configured to pass control commands from the programmable multimedia controller to the pre-amplifier; and a general-purpose computer of the programmable multimedia controller running a general-purpose operating system along with additional executable program code configured to interact with and control a plurality of separate audio components, video components and motor-operated devices coupled to the programmable multimedia controller, the executable program code to analyze the audio signal received from the pre-amplifier, and in response to the analysis, issue control commands to the pre-amplifier via the command pathway, the control commands configured to control pre-amplification functions performed by the pre-amplifier on the audio signal to adjust the audio signal, and the executable program code further to monitor the adjusted audio signal when received from the pre-amplifier via the pathway to verify adjustments have been implemented.

20. The apparatus of claim 19 wherein the pre-amplification functions includes one or more functions selected from the group consisting of equalization, tone control and audio mixing.

21. The apparatus of claim 19 wherein the executable program code configured to analyze the audio signal is configured to analyze the audio signal at least in part by measuring amplitude in a particular frequency band, and the control commands include one or more commands to adjust amplitude in the particular frequency band.

22. The apparatus of claim 21 wherein the executable program code is further configured to monitor adjusted amplitude to verify adjustments have been implemented.

23. The apparatus of claim 19 wherein at least some pre-amplification functions are performed in response to a bit-rate of the audio signal.

24. The apparatus of claim 19 further comprising:

an audio pathway for passing a second audio signal from the programmable multimedia controller to the pre-amplifier, the second audio signal from the programmable multimedia controller to be mixed with the audio signal prior to output of the adjusted audio signal from the pre-amplifier.

25. The apparatus of claim 19 wherein the executable program code is further configured to determine a rhythm of the audio signal and to generate graphics responsive at least to the rhythm, the graphics to be displayed on a display device.

26. The apparatus of claim 19 wherein the executable program code is further configured to display a virtual control panel on a display device for controlling pre-amplification functions.

27. The apparatus of claim 19 further comprising:

an second command pathway coupling the programmable multimedia controller to the power amplifier; and the executable program code further configured to send control commands to the power amplifier via the second command pathway to control the power amplifier.

28. A method for providing pre-amplification functions in an audio signal path comprising:

receiving an audio signal at a pre-amplifier;

providing the audio signal via an output of the pre-amplifier to a programmable multimedia controller, the programmable multimedia controller separate from the pre-amplifier and configured to interact with and control a plurality of separate audio components and video components about a building;

receiving back from the programmable multimedia controller one or more control commands, the control commands to specify particular pre-amplification functions to be performed on the audio signal;

performing the specified pre-amplification functions on the audio signal at the pre-amplifier to adjust the audio signal; and providing the adjusted audio signal from the pre-amplifier on the output coupled to the programmable multimedia controller and on a second output, the adjusted audio signal provided on the output coupled to the programmable multimedia controller to enable the programmable multimedia controller to monitor the adjusted audio signal to verify adjustments have been implemented.

29. An apparatus for providing pre-amplification functions in an audio signal path comprising:

an input of a programmable multimedia controller coupled via a pathway to a separate pre-amplifier and configured to receive an audio signal from an output of the pre-amplifier;

an output of the programmable multimedia controller coupled to the pre-amplifier by a command pathway and configured to pass control commands from the programmable multimedia controller to the pre-amplifier; and a general-purpose computer of the programmable multimedia controller running executable program code, the executable program code configured to interact with and control a plurality of separate audio components and video components about a building, the executable program code further configured to analyze the audio signal received from the pre-amplifier, and in response to the analysis, issue control commands to the pre-amplifier via the command pathway, the control commands configured to control pre-amplification functions performed by the pre-amplifier on the audio signal to adjust the audio signal, and the executable program code further to monitor the adjusted audio signal when received from the pre-amplifier via the pathway to verify adjustments have been implemented.

30. The apparatus of claim 29 wherein the control commands include one or more commands to adjust amplitude in a particular frequency band.

* * * * *